(12) United States Patent
Han

(10) Patent No.: US 11,010,578 B2
(45) Date of Patent: May 18, 2021

(54) CAPACITIVE FINGERPRINT RECOGNITION UNIT, CAPACITIVE MEASUREMENT CIRCUIT OF FINGERPRINT SENSOR, AND FINGERPRINT RECOGNITION DEVICE HAVING SAME

(71) Applicants: LEADING UI CO., LTD., Anyang-si (KR); Sang-hyun Han, Anyang-si (KR)

(72) Inventor: Sang-hyun Han, Anyang-si (KR)

(73) Assignee: LEADING UI Co., Ltd.

( * ) Notice: Subject to any disclaimer, the term of this patent is extended or adjusted under 35 U.S.C. 154(b) by 0 days.

(21) Appl. No.: 16/483,032

(22) PCT Filed: Jan. 8, 2018

(86) PCT No.: PCT/KR2018/000362
§ 371 (c)(1),
(2) Date: Aug. 1, 2019

(87) PCT Pub. No.: WO2018/151414
PCT Pub. Date: Aug. 23, 2018

(65) Prior Publication Data
US 2020/0234022 A1 Jul. 23, 2020

(30) Foreign Application Priority Data

Feb. 17, 2017 (KR) .................. 10-2017-0021713

(51) Int. Cl.
*G06K 9/00* (2006.01)
(52) U.S. Cl.
CPC .................. *G06K 9/0002* (2013.01)
(58) Field of Classification Search
CPC .................. G06K 9/0002; G06K 9/00
See application file for complete search history.

(56) References Cited

U.S. PATENT DOCUMENTS

| 2005/0122785 A1* | 6/2005 | Umeda | G06K 9/0002 365/187 |
| 2015/0254491 A1* | 9/2015 | Mo | G06F 3/0416 345/174 |

(Continued)

FOREIGN PATENT DOCUMENTS

| KR | 10-2004-0081886 A | 9/2004 |
| KR | 10-1085448 B | 11/2011 |

(Continued)

OTHER PUBLICATIONS

International Search Report dated Apr. 16, 2018.

*Primary Examiner* — Lixi C Simpson
(74) *Attorney, Agent, or Firm* — Leepi

(57) ABSTRACT

A capacitive fingerprint recognition unit using a thin-film transistor (TFT) sensor array to sense a user's fingerprint in a capacitive manner, a capacitance measurement circuit of a fingerprint sensor, and a fingerprint recognition device having the capacitance measurement circuit are disclosed. A capacitive fingerprint recognition unit includes a thin-film transistor (TFT) sensor array, a gate driver, an upper switch and a lower switch. The TFT sensor array includes a plurality of gate lines, a plurality of sensing lines, a plurality of TFTs connected to the gate line and the sensing line, and a fingerprint recognition pattern connected to each of the TFTs. The gate driver sequentially supplies a gate signal to the gate line. The upper switch is connected to a first end of each of the sensing lines and the lower switch is connected to a second end of each of the sensing lines.

21 Claims, 17 Drawing Sheets

(56) References Cited

U.S. PATENT DOCUMENTS

2017/0006245 A1* 1/2017 Akhavan Fomani ........................ G06K 9/0002
2020/0218869 A1* 7/2020 Han ................... G06K 9/00087

FOREIGN PATENT DOCUMENTS

| KR | 10-1376228 B | 4/2014 |
| KR | 10-2015-0115607 A | 10/2015 |
| KR | 10-2016-0033328 A | 3/2016 |
| KR | 10-2017-0016556 A | 2/2017 |

* cited by examiner

FIG. 4

| STAGE | INPUT SIGNAL | | | OUTPUT SIGNAL | | | | DESCRIPTION |
|---|---|---|---|---|---|---|---|---|
| | CON1 | OUT-H | OUT-L | SW-H | SW-L | DRV | CYC | |
| 1 | 0 | L | L | OFF | ON | L | L | INITIAL STATE |
| 2 | 1 | L | L | ON | OFF | L→H | L | INITIAL DRV RISING START |
| 3 | 1 | L | H | ON | OFF | L→H | L | SENSING-(RISING SIGNAL) |
| 4 | 1 | H | H | OFF | ON | H→L | H | RISING EDGE PEAK EDTECTION |
| 5 | 1 | L | H | OFF | ON | H→L | H | SENSING-(FALLING SIGNAL) |
| 6 | 1 | L | L | ON | OFF | L→H | L | FALLING EDGE PEAK EDTECTION |

CAPACITIVE FINGERPRINT RECOGNITION UNIT, CAPACITIVE MEASUREMENT CIRCUIT OF FINGERPRINT SENSOR, AND FINGERPRINT RECOGNITION DEVICE HAVING SAME

CROSS-REFERENCE TO RELATED APPLICATIONS

This application is a U.S. National Phase of International Application Number PCT/KR2018/000362, filed Jan. 8, 2018, and claims priority under 35 U.S.C. § 119 to Korean Patent Application No. 10-2017-0021713, filed on Feb. 17, 2017 in the Korean Intellectual Property Office (KIPO), the contents of which are herein incorporated by reference in their entirety.

BACKGROUND OF THE INVENTION

Technical Field

Exemplary embodiments of the present invention relate to a capacitance type fingerprint recognition unit, a capacitance measurement circuit of a fingerprint sensor, and a fingerprint recognition device having the capacitance measurement circuit. More particularly, exemplary embodiments of the present invention relate to a capacitive fingerprint recognition unit using a thin-film transistor (TFT) sensor array to sense a user's fingerprint in a capacitive manner, a capacitance measurement circuit of a fingerprint sensor, and a fingerprint recognition device having the capacitance measurement circuit.

Discussion of the Related Art

With the development of computer technology, various computer-based systems have been developed for various purposes such as a notebook computer, a tablet PC, a smart phone, a personal digital assistant, an automatic teller machine, and a search guide system. Because these systems typically store a large amount of confidential data such as business information or business secrets, as well as personal information related to personal privacy, there is a need to enhance security to protect these data.

In order to enhance security, a fingerprint sensor capable of enhancing security by registering or authenticating a system using a fingerprint of a finger has been known.

The fingerprint sensor is a sensor for detecting a human fingerprint, and is largely divided into an optical fingerprint sensor and a capacitive fingerprint sensor.

The optical fingerprint sensor uses a principle of irradiating a light source such as a light emitting diode (LED) or the like and detecting light reflected by ridges of a fingerprint through a CMOS image sensor. The optical fingerprint sensor has a limitation in reducing the size of the optical fingerprint sensor because it has to scan using LEDs. Also, since the light source itself is expensive, the manufacturing cost of the optical fingerprint sensor increases.

The capacitance type fingerprint sensor uses a difference in the amount of electricity charged between a ridge and a valley in contact with the fingerprint sensor. A typical capacitive fingerprint sensor is configured in the form of an assembly in combination with a specific push button and includes a silicon wafer printed circuit for measuring the capacitance between the capacitive plate and the user's fingerprint (ridge and valley). Since the ridges and valleys of the fingerprints are very small in size from about 300 µm to about 500 µm, the capacitive fingerprint sensor requires a high-resolution sensor array and an integrated chip (IC) for fingerprint recognition processing. To this end, a silicon wafer capable of integrally forming a sensor array and an IC is used.

However, when a high-resolution sensor array and an IC are formed together using a silicon wafer, an assembly structure for combining a fingerprint sensor with a push button is required. Therefore, not only the configuration is complicated, but also the non-display area (bezel area) increases. Further, since the push button (for example, the home key of the smart phone) and the fingerprint sensor are formed to overlap with each other, the thickness of the push button is increased, and the fingerprint sensing area is dependent on the size of the push button.

SUMMARY

Exemplary embodiments of the present invention provide a capacitive fingerprint recognition unit that uses a TFT sensor array to sense a user's fingerprint in a capacitive manner.

Exemplary embodiments of the present invention also provide a capacitance measurement circuit of a fingerprint sensor for reducing the error rate of measurement values by changing the path of the sensing signal via the TFT sensor array from one side of the TFT sensor array to the other side of the TFT sensor array.

Exemplary embodiments of the present invention further also provide a fingerprint recognition device including the above-mentioned capacitance measurement circuit of the fingerprint sensor.

According to one aspect of the present invention, a capacitive fingerprint recognition unit includes a thin-film transistor (TFT) sensor array, a gate driver, an upper switch and a lower switch. The TFT sensor array includes a plurality of gate lines, a plurality of sensing lines, a plurality of TFTs connected to the gate line and the sensing line, and a fingerprint recognition pattern connected to each of the TFTs. The gate driver sequentially supplies a gate signal to the gate line. The upper switch is connected to a first end of each of the sensing lines to switch an output path of a driving signal for fingerprint recognition and a sensing signal according to fingerprint recognition. The lower switch is connected to a second end of each of the sensing lines to switch and output path of a driving signal for fingerprint recognition and a sensing signal according to fingerprint recognition.

In an exemplary embodiment, during a first time period, the upper switch may provide a driving signal for fingerprint recognition provided from an outside to a first end of each of the sensing lines, and the lower switch may provide a sensing signal according to the fingerprint recognition received through a second end of each of the sensing lines to the outside. During a second time period, the lower switch may provide a driving signal for fingerprint recognition provided from an outside to the second end of each of the sensing lines, and the upper switch may provide a sensing signal according to the fingerprint recognition received through the first end of each of the sensing lines to the outside.

In an exemplary embodiment, the first time period and the second time period may be within an active period of a gate signal applied to the gate line.

In an exemplary embodiment, during a period in which one gate line is active, a driving signal for fingerprint recognition may be sequentially applied to a first end of each of the sensing lines, a sensing signal corresponding to fingerprint recognition may be sequentially output through a second end of each of the sensing lines. The driving signal may be sequentially applied to the second end of each of the sensing lines, and the sensing signal may be sequentially output through the first end of each of the sensing lines.

In an exemplary embodiment, the gate driver, the upper switch and the lower switch may be formed in an area surrounding the TFT sensor array.

According to another aspect of the present invention, a capacitance measuring circuit of a fingerprint sensor connected to a thin-film transistor (TFT) sensor array includes a plurality of gate lines, a plurality of sensing lines, a plurality of TFTs connected to the gate line and the sensing line, and a fingerprint recognition pattern connected to each of the TFTs to recognize a fingerprint. The capacitance measuring circuit includes a gate driver, an upper switch, a lower switch, a sensing driver and a timing control unit. The gate driver sequentially supplies gate signals to the gate lines. The upper switch is connected to a first end of each of the sensing lines. The lower switch is connected to a second end of each of the sensing lines. The sensing driver provides a first driving signal for fingerprint recognition to the upper switch, receives a first direction sensing signal according to fingerprint recognition through the lower switch for a first time, provides a second driving signal for fingerprint recognition to the lower switch, and receives a second direction sensing signal according to fingerprint recognition through the upper switch for a second time. The timing control unit controls the gate driving unit and the sensing driving unit, and determines the sensitivity of the touch based on the first direction sensing signal and the second direction sensing signal.

In an exemplary embodiment, during the first time, the upper switch may sequentially provide the first driving signal to each of the sensing lines, and the lower switch may sequentially receive the first direction sensing signal from each of the sensing lines.

In an exemplary embodiment, during the second time, the lower switch may sequentially provide the second driving signal to each of the sensing lines, and the upper switch may sequentially receive the second direction sensing signal from each of the sensing lines.

In an exemplary embodiment, the sensing driver may include a voltage comparison unit, a control unit, a transmission/reception switching unit, a charge/discharge circuit part and a timer unit. The voltage comparison unit outputs a first comparison signal comparing a first reference voltage with a sensing voltage based on the fingerprint recognition pattern and a second comparison signal comparing a second reference voltage with the sensing voltage in response to a first control signal. The control unit outputs a charge control signal and a discharge control signal based on the first and second comparison signals in response to a second control signal. The transmission/reception switching unit is connected to both ends of the sensing lines, and is designed to set a path for transmitting a driving signal to the sensing line and a path for receiving a sensing signal sensing a capacitance change amount of the fingerprint recognition pattern via the sensing line in response to a third control signal. The charge/discharge circuit part charges the fingerprint recognition pattern connected to the sensing line selected by the transmission/reception switching unit from the first reference voltage to the second reference voltage or discharges from the first reference voltage to the first reference voltage in response to the charge control signal and the discharge control signal. The timer unit measures a charging time and a discharging time of the charge/discharge circuit unit and a time required for the entire charging and discharging, respectively, to output an output signal according to the measuring, in response to the third control signal and the fourth control signal.

In an exemplary embodiment, the timing control unit may include a control signal generator and a counter. The control signal generator generates a gate control signal (GS) controlling an operation of the gate driver, the first control signal, the second control signal, the charge control signal, the discharge control signal, the third control signal and the fourth control signal based on a clock. The counter provides the clock to the control signal generator, counts the number of pulses in accordance with the first direction sensing signal to output the counted number to an external device, and counts the number of pulses corresponding to the second direction sensing signal to output the counted number to the external device.

According to another aspect of the present invention, a fingerprint recognition device includes a thin-film transistor (TFT) sensor, a gate driver, an upper switch, a lower switch, a sensing driver and a timing control unit. The TFT sensor array includes a plurality of gate lines, a plurality of sensing lines, a plurality of TFTs connected to the gate line and the sensing line, and a fingerprint recognition pattern connected to each of the TFTs. The gate driver sequentially supplies gate signals to the gate lines. The upper switch is connected to a first end of each of the sensing lines. The lower switch is connected to a second end of each of the sensing lines. The sensing driver provides a first driving signal for fingerprint recognition to the upper switch, receives a first direction sensing signal according to fingerprint recognition through the lower switch for a first time, provides a second driving signal for fingerprint recognition to the lower switch and receives a second direction sensing signal according to fingerprint recognition through the upper switch for a second time. The timing control unit controls the gate driving unit and the sensing driving unit, and determines the sensitivity of the touch based on the first direction sensing signal and the second direction sensing signal to measure whether a ridge of the user finger is laid on a specific pixel.

In an exemplary embodiment, a drain electrode of the TFT may extend to define the fingerprint recognition pattern.

In an exemplary embodiment, the TFT sensor array may further include a transparent electrode connected to a drain electrode of the TFT to define the fingerprint recognition pattern.

In an exemplary embodiment, the TFT sensor array may be formed on a glass substrate or a flexible substrate.

In an exemplary embodiment, the capacitance measuring circuit may determine the sensitivity of the touch based on a value obtained by arithmetically summing the first direction sensing signal and the second direction sensing signal.

In an exemplary embodiment, the capacitance measuring circuit may determine the sensitivity of the touch based on a value obtained by arithmetically averaging the first direction sensing signal and the second direction sensing signal.

In an exemplary embodiment, the TFT sensor array may be formed on a front surface of a base substrate, and a rear surface of the base substrate contacts to a printed circuit board.

In an exemplary embodiment, the fingerprint recognition device may further include a filling material disposed over the TFT sensor array, and a cover window disposed on the filling material.

In an exemplary embodiment, the fingerprint recognition device may further include a bonding wire electrically connecting the TFT sensor array and the printed circuit board.

In an exemplary embodiment, the sensing driver and the timing control unit may be implemented in an IC form to be mounted on the printed circuit board.

In an exemplary embodiment, the TFT sensor array may be formed on a front surface of a base substrate, and the front surface of the base substrate may contact to a printed circuit board or a flexible printed circuit board.

In an exemplary embodiment, the front surface of the base substrate may be electrically connected to the printed circuit board or the flexible printed circuit board by conductive bumps or conductive balls.

According to the capacitance type fingerprint recognition unit, the capacitance measurement circuit of the fingerprint sensor and the fingerprint recognition device having the capacitance measurement circuit, the user's fingerprint is capacitively sensed using a TFT sensor array, and the error rate of the measurement value obtained through the fingerprint sensor may be reduced by changing a path of a sensing signal via the TFT sensor array from one side of the TFT sensor array to the other side of the TFT sensor array.

BRIEF DESCRIPTION OF THE DRAWINGS

The above and other features and aspects of the present invention will become more apparent by describing in detailed exemplary embodiments thereof with reference to the accompanying drawings, in which:

FIG. 4 is a table explaining input and output signals of a control unit shown in FIG. 2A and FIG. 2B;

DETAILED DESCRIPTION OF THE INVENTION

Figure 1A:
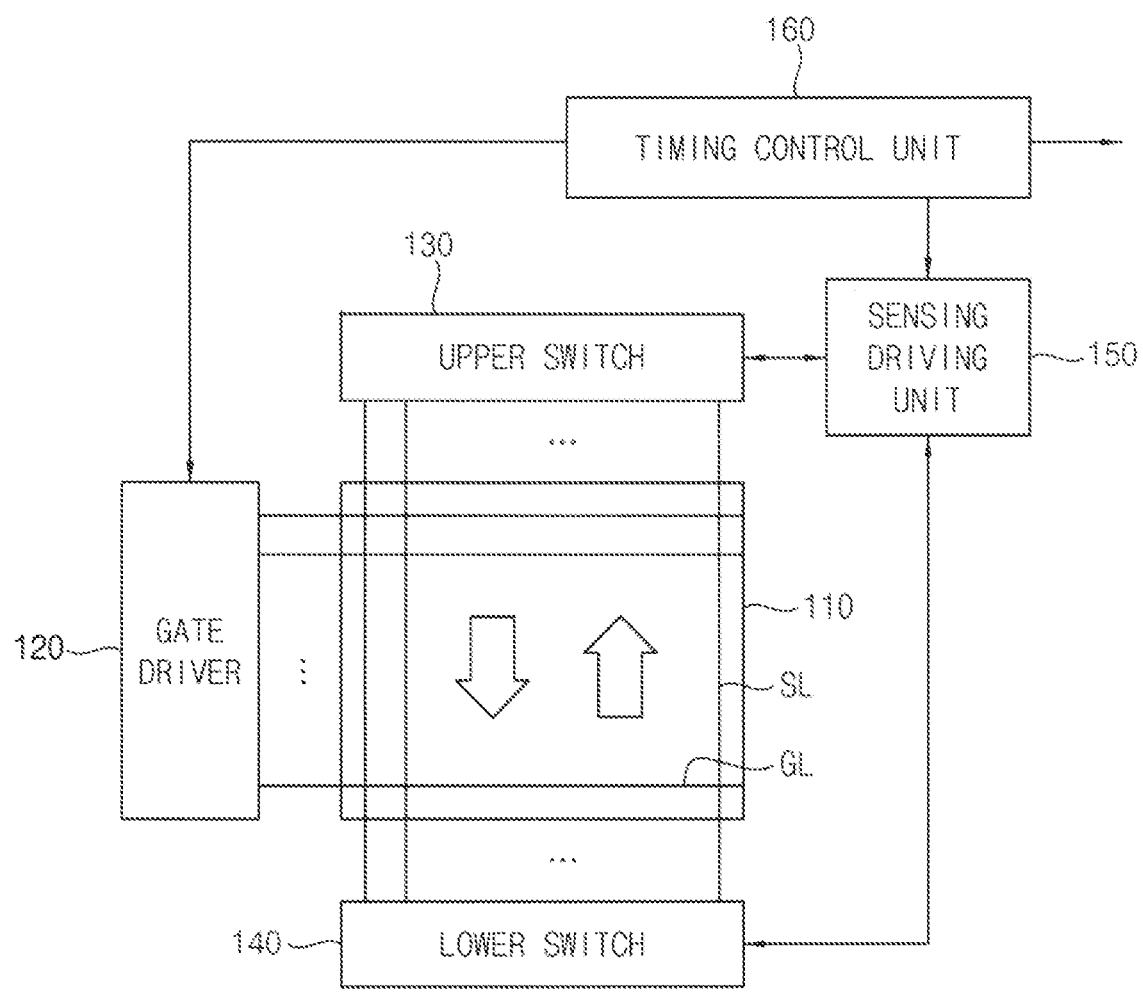
FIG. 1A is a block diagram schematically explaining a fingerprint recognition device according to an exemplary embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1B:
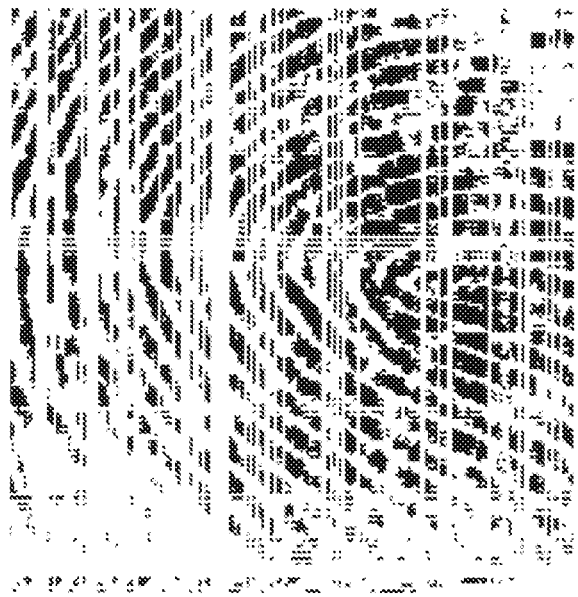
FIG. 1B shows an example of an image of a fingerprint recognized by FIG. 1A.

FIG. 1A is a block diagram schematically explaining a fingerprint recognition device according to an exemplary embodiment of the present invention, and FIG. 1B shows an example of an image of a fingerprint recognized by FIG. 1B.

Referring to FIG. 1A, a fingerprint recognition device according to an exemplary embodiment of the present invention includes a TFT sensor array 110, a gate driver 120, an upper switch 130, a lower switch 140, a sensing driving unit 150 and a timing control unit 160. In the present exemplary embodiment, the gate driver 120, the upper switch 130 and the lower switch 140 may be formed in a peripheral area surrounding the TFT sensor array 110. The gate driver 120, the upper switch 130 and the lower switch 140 may be formed when fabricating the TFT sensor array 110.

The TFT sensor array 110 includes a plurality of gate lines GL, a plurality of sensing lines SL, a plurality of thin-film transistors (TFTs) (not shown) connected to the gate lines and the sensing lines, and a fingerprint recognition pattern (not shown) connected to each of the TFTs. In the present exemplary embodiment, each of the TFTs may be an n-channel MOSFET transistor.

The gate driver 120 sequentially provides gate signals to the gate lines GL. The gate driver 120 may be formed in a peripheral area of the TFT sensor array 110.

The upper switch 130 is connected to a first end of each of the sensing lines SL to switch an output path of a driving signal for fingerprint recognition and a sensing signal according to the fingerprint recognition. The upper switch 130 may be formed in a peripheral area of the TFT sensor array 110.

The lower switch 140 is connected to a second end of each of the sensing lines SL to switch an output path of a driving signal for fingerprint recognition and a sensing signal according to the fingerprint recognition. The lower switch 140 may be formed in a peripheral area of the TFT sensor array 110.

During the first time period, the sensing driving unit 150 sequentially supplies a driving signal for fingerprint recognition to a first end of each of the sensing lines SL via the upper switch 130, and receives a first direction sensing signal via the lower switch 140 to provide the timing control unit 160 with the timing signal. Moreover, during the second time period, the sensing driving unit 150 sequentially supplies the driving signals to a second end of the sensing lines SL via the lower switch 140, and receives a second direction sensing signal corresponding to the fingerprint recognition via the upper switch 130 to provide the timing control unit 160 with the timing signals. In the present exemplary embodiment, the first time period and the second time period are present in an active period of the gate signal applied to the gate line.

The timing controller 160 controls the gate driver 120 and the sensing driving unit 150, and provides a measurement result for determining the sensitivity of the touch to an external device such as a host based on the first direction sensing signal and the second direction sensing signal. Accordingly, the external device may measure whether the ridge of the user finger is laid on a specific pixel or not, based on the measurement result, and may display an image as shown in FIG. 1B.

As described above, the TFT sensor array is used to capacitively sense the user's fingerprint. In particular, by changing the path of the sensing signal via the TFT sensor array from one side to the other side of the TFT sensor array, the error rate of the measured value obtained through the fingerprint sensor can be reduced.

Figure 2A:
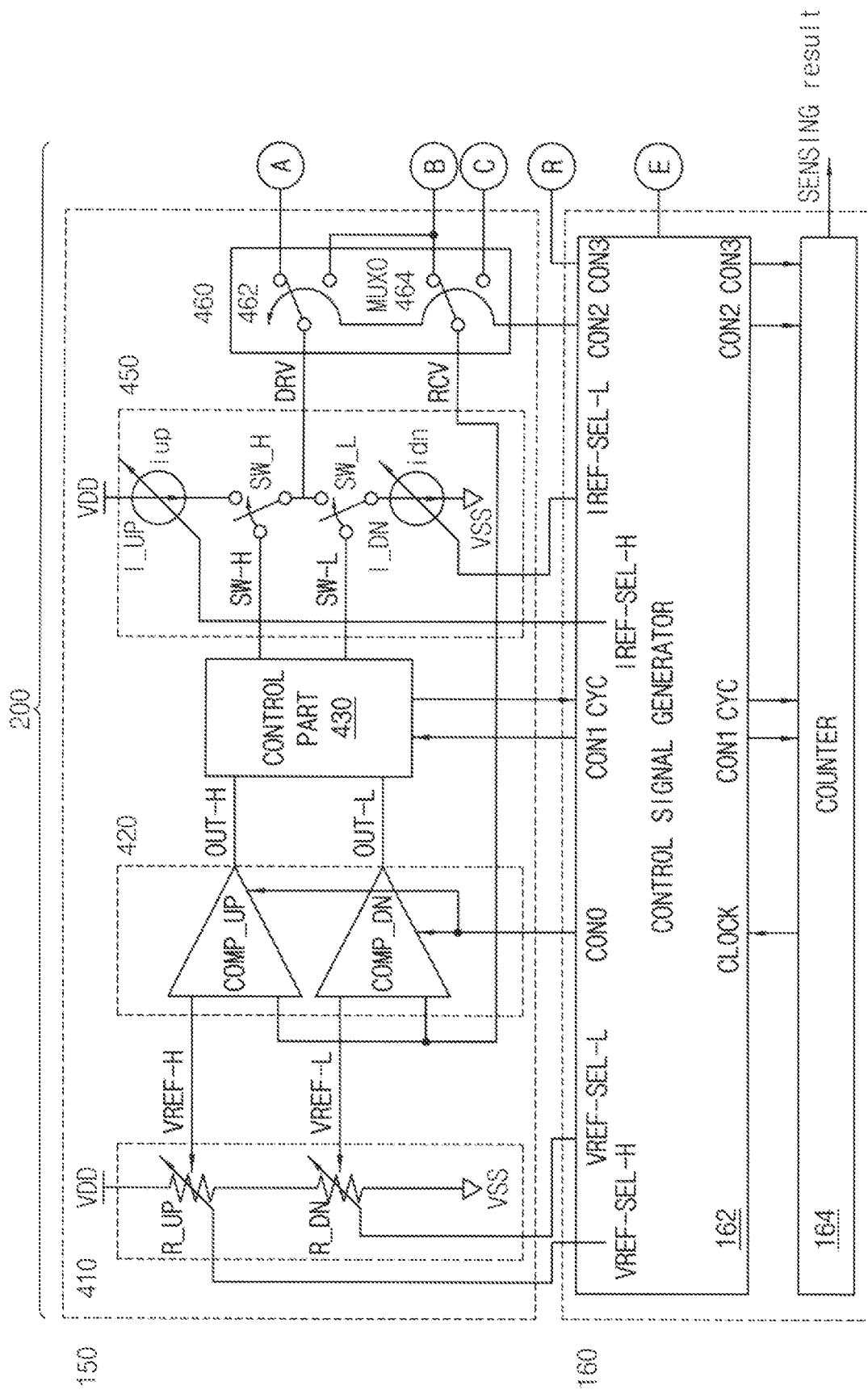
FIG. 2A and FIG. 2B are block diagrams explaining the fingerprint recognition device shown in FIG. 1A.
Figure 2B:
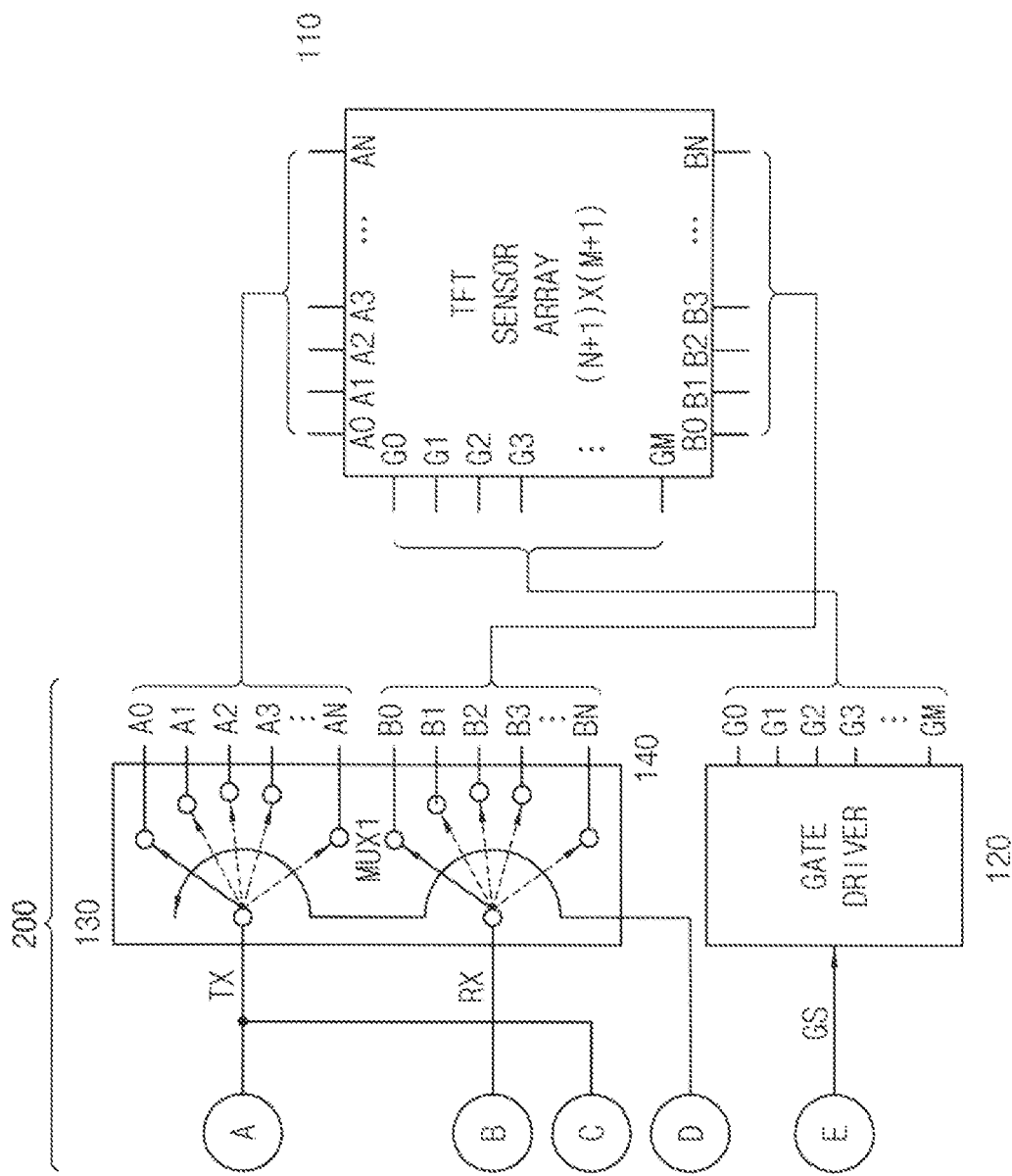
Figure 3A:
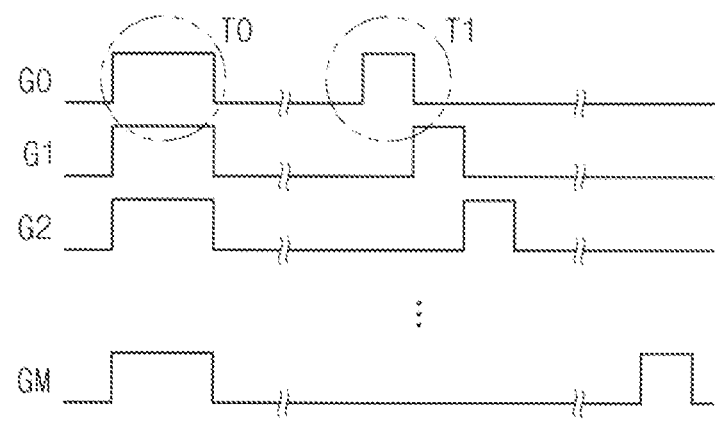
FIG. 3A is a waveform diagram explaining gate signals in the fingerprint recognition device shown in FIG. 2A and FIG. 2B.
Figure 3B:
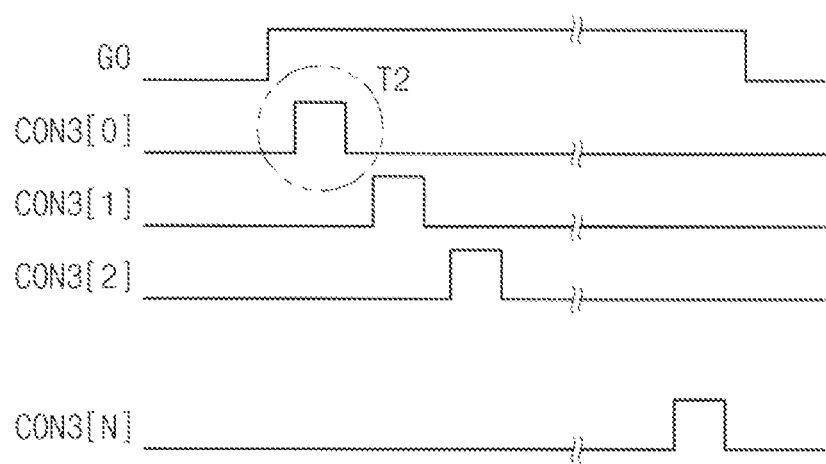
FIG. 3B is a waveform diagram explaining a fourth control signal for sequentially sensing the sensing signals corresponding to the first gate signal.
Figure 3C:
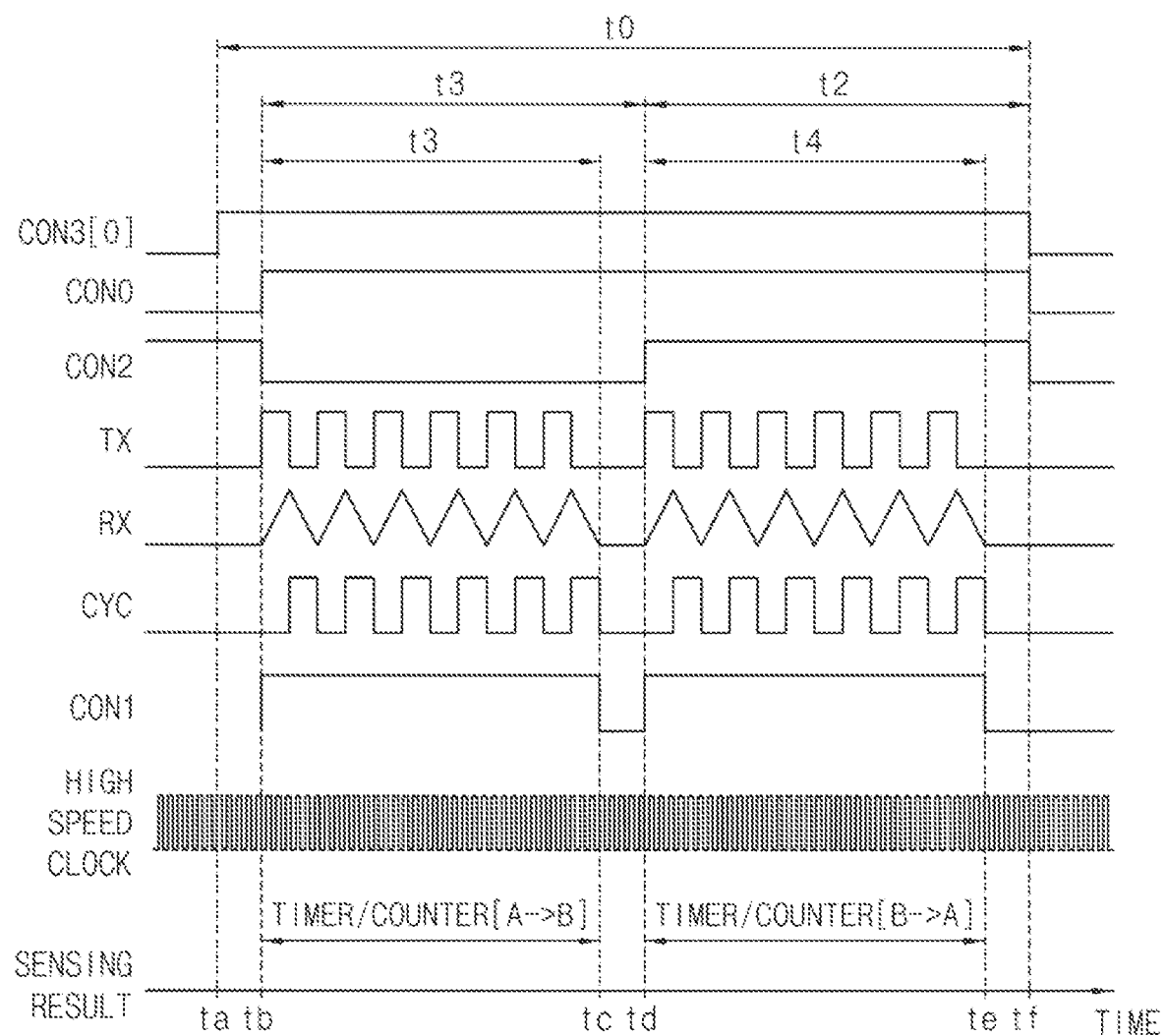
FIG. 3C is a waveform diagram explaining signals corresponding to the fourth control signal for detecting a sensing signal in the first sensing line.

FIG. 2A and FIG. 2B are block diagrams explaining the fingerprint recognition device shown in FIG. 1A. FIG. 3A is a waveform diagram explaining gate signals in the fingerprint recognition device shown in FIG. 2A and FIG. 2B, FIG. 3B is a waveform diagram explaining a fourth control signal for sequentially sensing the sensing signals corresponding to the first gate signal, and FIG. 3C is a waveform diagram explaining signals corresponding to the fourth control signal CON3 for detecting a sensing signal in the first sensing line.

Referring to FIG. 2A to FIG. 3C, a fingerprint recognition device according to an exemplary embodiment of the present invention includes a TFT sensor array 110 and a capacitance measurement circuit 200.

The TFT sensor array 110 includes a plurality of gate lines GL, a plurality of sensing lines SL, a plurality of TFTs connected to the gate lines GL and the sensing lines SL, and a plurality of fingerprint recognition pattern connected to the TFTs.

The capacitance measuring circuit 200 includes a gate driving unit 120, an upper switch 130, a lower switch 140, a sensing driving unit 150 and a timing control unit 160.

The gate driver 120 sequentially provides gate signals to the gate lines GL.

The upper switch 130 and the lower switch 140 select the sensing lines SL so that the driving signals TX are sequentially provided to the sensing lines SL. Moreover, the upper switch 130 and the lower switch 140 select the sensing lines SL so that the second signals RX are sequentially provided to the sensing lines SL.

For example, the upper switch 130 and the lower switch 140 may output the driving signal TX in the order of one end of the sensing lines SL, that is, A0, A1, A2, . . . , AN, and may sequentially receive the sensing signal RX in the same order as the other terminals of the sensing lines SL, that is, B0, B1, B2, . . . , BN, by setting the switching path. The upper switch 130 and the lower switch 140 may sequentially output the driving signals TX in the order of one end of the sensing lines SL, that is, AN, AN−1, . . . , A1, A0, and may sequentially receive the sensing signal RX in the order of the other ends of the sensing lines SL, that is, BN, BN−1, B1, . . . , B0, by setting the switching path.

The sensing driving unit 150 includes a reference voltage generator 410, a voltage comparison unit 420, a control unit 430, a charge/discharge circuit unit 450, and a transmission/reception switching unit 460. During a first time, the sensing driving unit 150 provides a driving signal TX for recognizing the fingerprint to a first end of each of the sensing lines SL, and receives a first direction sensing signal according to the fingerprint recognition through a second end of each of the sensing lines SL. During a second time, the sensing driving unit 150 provides the driving signal TX to the second end of each of the sensing lines SL, and receives a second direction sensing signal according to the fingerprint recognition through the first end of each of the sensing lines SL.

The sensing driving unit 150 is connected to a plurality of fingerprint recognition patterns to apply a constant current to each of the fingerprint recognition patterns. The sensing driving unit 150 measures the capacitances of the fingerprint recognition pattern by measuring the time required for discharging the capacitance of the capacitance generated by the ridge or the valley of the finger and the fingerprint recognition pattern to the reference voltage. Specifically, charge/discharge circuit unit 450 continuously performs charging/discharging of the constant cycle N times. When the capacitance is inputted from the fingerprint recognition pattern respectively connected to the upper switch 130 and the lower switch 140, a time difference is generated in the certain period, and the counter 164 measures the accumulated time difference during the N cycles so that it is determined whether the capacitance is inputted. When the capacitance is measured through the fingerprint recognition pattern as the number of charge/discharge increases, the time required for charge/discharge increases proportionally.

The reference voltage generating unit 410 includes a first resistor R_UP and a second resistor R_DN connected in series. The reference voltage generating unit 410 generates a first reference voltage VREF-H and a second reference voltage VREF-L and provides the first and second reference voltages VREF-H and VREF-L to the voltage comparison unit 20. In the present exemplary embodiment, the first resistor R_UP and the second resistor R_DN are variable resistors. The resistance value of the first and second variable resistor R_UP and R_DN may be changed by a program. Accordingly, the first reference voltage VREF-H and the second reference voltage VREF-L are also variable voltages.

When the noise of the power source applied to the capacitance measuring circuit 200 is high or the noise from the outside is large, the first reference voltage VREF-H and the second reference voltage VREF-L May be changed to a program so that a reference voltage that is not affected by noise can be set. In particular, as the area of the fingerprint recognition pattern formed to detect the capacitance is wider, the noise is much introduced due to the influence of the external environment, and the capacitance sensing characteristic is deteriorated. However, if the difference between the first reference voltage VREF-H and the second reference voltage VREF-L is controlled small, the noise characteristic can be further reduced. However, when the difference between the voltages of the first reference voltage VREF-H and the second reference voltage VREF-L is set small, the SNR (signal-to-noise ratio) of the result of capacitance measurement during the same time is improved. However, since a certain portion of the capacitance sensing signal is reduced, the first reference voltage VREF-H and the second reference voltage VREF-L are selected according to the application.

The voltage comparison unit 420 compares the voltages generated by the reference voltage generating unit 410 with the sensing voltages input from the fingerprint recognition pattern in response to a first control signal CON0 provided from an external device. For example, the voltage comparison unit 420 includes a first voltage comparator COMP_UP and a second voltage comparator COMP_DN. In the present exemplary embodiment, the first control signal CON0 enables or disables the first and second voltage comparators COMP_UP and COMP_DN. That is, the first control signal CON0 having the H level enables the first and second voltage comparators COMP_UP and COMP_DN, and the first control signal CON0 having the L level disables the first and second comparators COMP_UP and COMP_DN.

The first voltage comparator COMP_UP compares the first reference voltage VREF-H generated by the reference voltage generator 410 with a sensing voltage input from the fingerprint recognition pattern to output a first comparison signal OUT-H in response to the first control signal CON0 having the H level. The first comparison signal OUT-H is output to the predetermined H level when the voltage of the signal compared in the first voltage comparator COMP_UP is equal to or higher than the voltage of the first reference voltage VREF-H, and the first comparison signal OUT-H is output to the L level when the voltage of the signal compared in the voltage comparator COMP_UP is lower than the voltage of the first reference voltage VREF-H. When the first comparison signal OUT-H of H level is output, the charge control signal SW-H and the discharge control signal SW-L output from the control unit 430 are controlled so that the driving signal DRV is immediately changed from the H level to the L level within a predetermined delay time existing in the circuit during an operation period (that is, the second control signal CON1 is H).

The second voltage comparator COMP_DN compares the second reference voltage VREF-L generated by the reference voltage generator 410 with the sensing voltage input from the fingerprint recognition pattern to output a second comparison signal OUT-L in response to the first control signal CON0 having the H level. The second comparison signal OUT-L is output to the predetermined H level when the voltage of the signal compared in the second voltage comparator COMP_DN is equal to or higher than the voltage of the second reference voltage VREF-L, and the second comparison signal OUT-L is output to the L level when the voltage of the signal compared in the voltage comparator COMP_DN is lower than the voltage of the second reference voltage VREF-L. When the second comparison signal OUT-L of H level is output, the charge control signal SW-H and the discharge control signal SW-L output from the control unit 430 are controlled so that the driving signal DRV is immediately changed from the L level to the H level within a predetermined delay time existing in the circuit during an operation period (that is, the second control signal CON1 is H).

In the present exemplary embodiment, each of the first and second voltage comparators COMP_UP and COMP_DN may include a voltage comparator with hysteresis characteristics. The voltage comparators having hysteresis characteristics are also referred to as comparators having a Schmitt trigger. By using the voltage comparators, it is possible to prevent the comparator from operating too sensitively when the noise of the VDD supply voltage applied to the capacitance measurement circuit 200 or the noise of the GND level voltage is applied. Therefore, when a semiconductor developed on the basis of the present specification operates in an application circuit, it is possible to improve a signal-to-noise ratio (SNR) from noise due to a power supply.

The control unit 430 receives the first comparison signal OUT-H and the second comparison signal OUT_L, which are the output signals of the first voltage comparator COMP_UP and the second voltage comparator COMP_DN of the voltage comparison part 420 and a second control signal CON1 provided from an external device, and controls the operation of the charge/discharge circuit unit 450 and the operation of the timing control unit 160.

The control unit 430 operates as a table shown in FIG. 3 and generates a charge control signal SW-H, a discharge control signal SW-L and a CYC using the output value of the comparator and the control signal CON1.

FIG. 4 is a table explaining input and output signals of a control unit shown in FIG. 2A and FIG. 2B.

Referring to FIG. 2A to FIG. 4, the charge control signal SW-H and the discharge control signal SW-L turn on/off the current iup generated from the upper current source I_UP and the current idn generated from the lower current source I_DN to generate an output signal DRV.

The CYC is transmitted to the control signal generator 162 of the timing control unit 160 and the counter 164 of the timing control unit 160 to be used to measure the sensing sensitivity.

The control unit 430 starts the operation in the initial stage 1 and then sequentially operates in the order of the stage 2, the stage 3, the stage 4, the stage 5, the stage 6, the stage 2, the stage 3 (2→3→4→5→6→2→3). The sensing is continuously repeated until the number of sensing cycles defined by the control signal generator 162 and the number of cycles determined from the CYC period are reached.

Referring again to FIG. 2A and FIG. 2B, the charge/discharge circuit unit 450 is connected to the control unit 430 and the transmission/reception switching unit 460. The charge/discharge circuit unit 450 charges the sensing voltage RX input through the upper switch 130 or the sensing voltage RX input through the lower switch 140 from the first reference voltage VREF-H to the second reference voltage VREF-L or discharges the sensing voltage RX from second reference voltage VREF-L to the first reference voltage VREF-H, in response to the discharge control signal SW-H and the discharge control signal SW-L provided from a control unit 430. That is, when the first switch SW_H is turned on and the second switch SW_L is turned off, the charge/discharge circuit unit 450 outputs the charge current iup generated based on the power supply voltage VDD of the power voltage terminal to charge the fingerprint recognition pattern. When the first switch SW_H is turned off and the second switch SW_L is turned on, the charge/discharge circuit unit 450 discharges the discharge current idn corresponding to the charge voltage of the fingerprint recognition pattern through the ground terminal.

The transmission/reception switching unit 460 includes a transmission switch 462 and a reception switch 46. The transmission/reception switching unit 460 switches an output direction of the transmission signal DRV for the driving signal TX and an output direction of the reception signal RCV corresponding to the sensing signal RX in response to a third control signal CON2 provided from an external device.

In the present exemplary embodiment, the third control signal CON2 performs a role of determining a signal transmission path of the transmission/reception switching unit 460. That is, the transmission/reception switching unit 460 sets whether to supply the driving signal TX for fingerprint recognition to a first end of the sensing line or to a second end of the sensing line under the control of the third control signal CON2.

Moreover, the transmission/reception switching unit 460 sets whether or not to receive the sensing signal RX according to the fingerprint recognition through a second end of the sensing line or a first end of the sensing line in response to a third control signal CON2. Accordingly, the driving signal TX may be supplied in a first direction (e.g., forward direction) or a second direction (e.g., reverse direction) with respect to the sensing line. Moreover, the sensing signal RX may be received in the first direction or in the second direction with respect to the sensing line.

The timing control unit 160 includes a control signal generator 162 and a counter 164. The timing control unit 160 controls operations of the gate driver 120 and the sensing driving unit 150. The timing control unit 160 determines the sensitivity of the touch based on the first direction sensing signal and the second direction sensing signal to measure whether or not the ridge of the user finger is laid on the specific pixel.

Particularly, the control signal generator 162 generates a gate switching signal GS for controlling the operation of the gate driver 120, the first control signal CON0, the second control signal CON1, the charge control signal SW-H, the discharge control signal SW-L, the third control signal CON2 and the fourth control signal CON3 based on a clock CLOCK provided from the counter 164.

The counter 164 counts the number of pulses according to the first direction sensing signal to output the counted number of the first direction sensing signal to an external device, and counts the number of pulses according to the second direction sensing signal to output the counted number of the second direction sensing signal to the external device. The counter 164 measures a charging time and a discharging time of the charging/discharging circuit unit 450 and a time required for the entire charging and discharging in response to the fourth control signal CON3 provided from an external device, and outputs a measurement signal corresponding to the result.

In the present exemplary embodiment, the fourth control signal CON3 controls the operation of the counter 164. For example, in the interval in which the fourth control signal CON3 is at the H level edge, the counter 164 is initialized and simultaneously the counter 164 is operated for a predetermined period of the sensing signal so that the number of clocks is calculated. In the edge period of the L level occurring after the edge period of the first H level, the fourth control signal CON3 stops the operation of the counter 164 and maintains the value of the counter 164 so as to transmit the measurement result.

The operation described above is continuously repeated in the interval in which the second control signal CON1 is at H level. The output value of the counter 164 is recognized as the capacitance value of each pad by the third control signal CON2.

An initial start starts at the output signal of the charge/discharge circuit section 450, that is, the capacitance sense signal is at a ground level of 0V. At this time, the signal has a value lower than the first reference voltage VREF-H and the second reference voltage VREF-L. The second reference voltage VREF-L is typically a voltage slightly higher than GND 0V. For example, the second reference voltage VREF-L may be set to 300 mV. The first reference voltage VREF-H may be set from ½ VDD to VDD-300 mV.

When the capacitance measurement circuit 200 operates in a steady state, the comparator 420 and the control unit 430 are operated to has a linear shape with a slope rising in the form of a triangle wave from the reference voltage VREF-L to the first reference voltage VREF-H when a voltage of the signal is lower than the second reference voltage VREF-L.

On the other hand, when the voltage of the signal reaches the first reference voltage VREF-H, the switch SW is connected to operate so that the capacitance sensing signal has a shape of a sloped straight line that falls in a triangular shape.

Figure 5A:
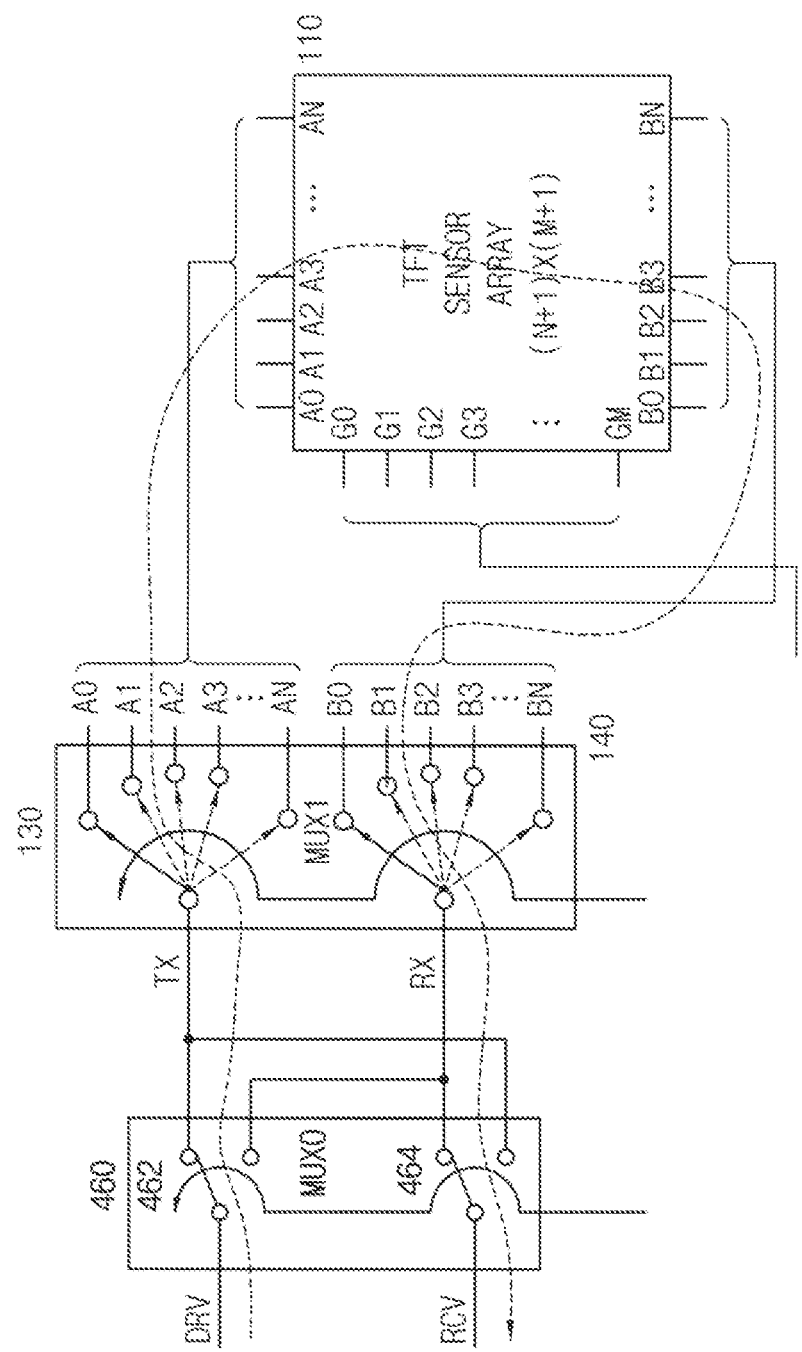
FIG. 5A and FIG. 5B are conceptual diagrams schematically explaining paths of a driving signal and a sensing signal in the fingerprint recognition device shown in FIG. 2A and FIG. 2B.
Figure 5B:
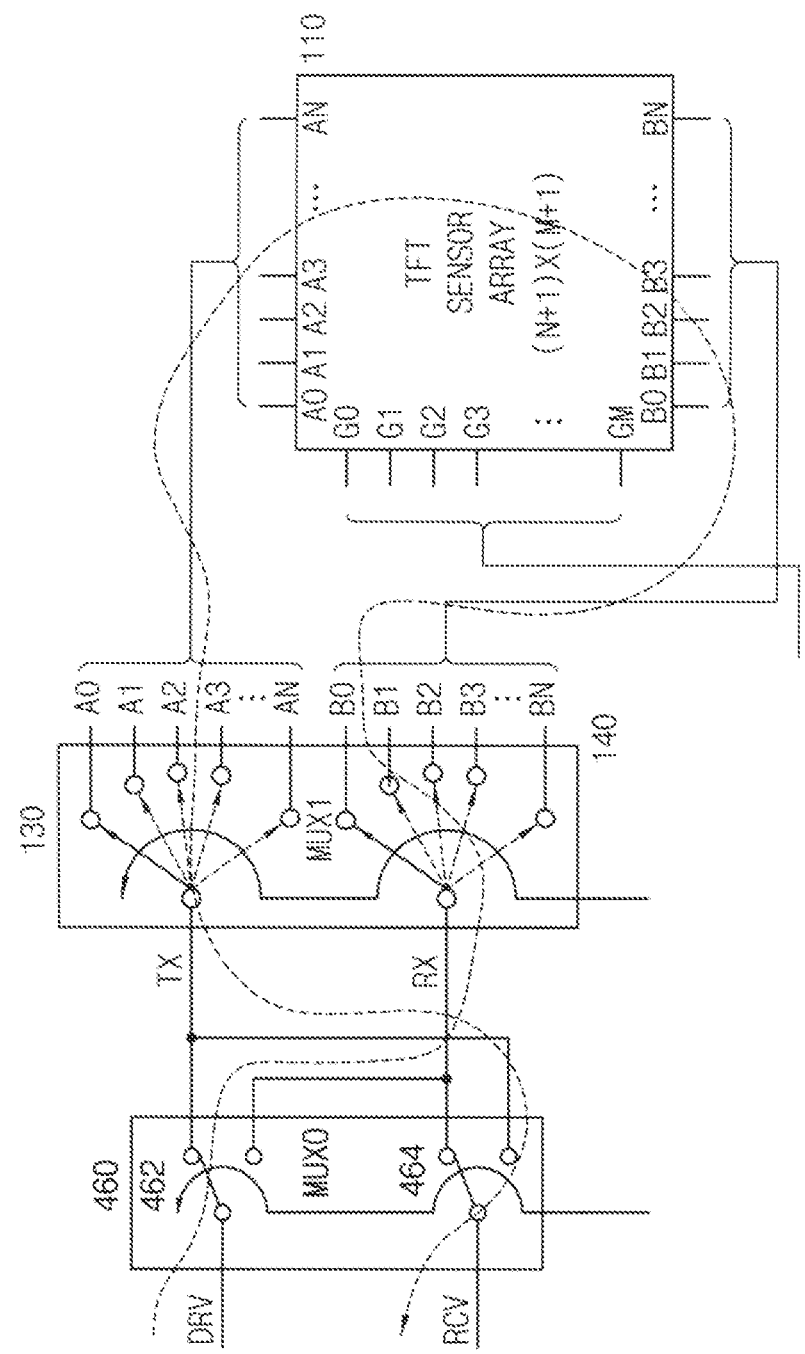

FIG. 5A and FIG. 5B are conceptual diagrams schematically explaining paths of a driving signal and a sensing signal in the fingerprint recognition device shown in FIG. 2A and FIG. 2B. Particularly, FIG. 5A shows a path in which a driving signal is applied through a first end of the sensing line and a sensing signal is received through a second end of the sensing line, FIG. 5B shows a path in which a driving signal is applied through the second end of the sensing line and a sensing signal is received through the second end of the sensing line.

Referring to FIG. 5A, a driving signal is transmitted from an upper side of the TFT sensor array 110 to a lower side of the TFT sensor array 110, that is through the first end of the sensing line, and a sensing signal is output through the second end of the sensing line, so that a change amount of the capacitance is sensed.

When the third control signal CON2 is 0, a first sensing path is formed in which the driving signal DRV is applied to a first end of the sensing line via the transmission switch 462 of the transmission/reception switching unit 460 and the upper switch 130 and the sensing signal RCV passed through the sensing line is input via the lower switch 140 and the receiving switch 464 of the transmission/reception switching unit 460 through a second end of the sensing line.

Referring to FIG. 5B, a driving signal is transmitted from a lower side of the TFT sensor array 110 to a upper side of the TFT sensor array 110, that is through the second end of the sensing line, and a sensing signal is output through the first end of the sensing line, so that a change amount of the capacitance is sensed.

When the third control signal CON2 is 1, a second sensing path is formed in which the driving signal DRV is applied to a first end of the sensing line via the transmission switch 462 of the transmission/reception switching unit 460 and the lower switch 140 and the sensing signal RCV passed through the sensing line is input via the upper switch 130 and the receiving switch 464 of the transmission/reception switching unit 460 through a first end of the sensing line.

According to the present invention, since the first sensing path and the second sensing path are opposite to each other in the flow of the signal, the same sensing circuit may be used to adjust the sense path through the complex type switch 460. Thus by obtaining the measured value, the error rate due to the deviation between the internal circuits of the semiconductor may be reduced.

Figure 6:
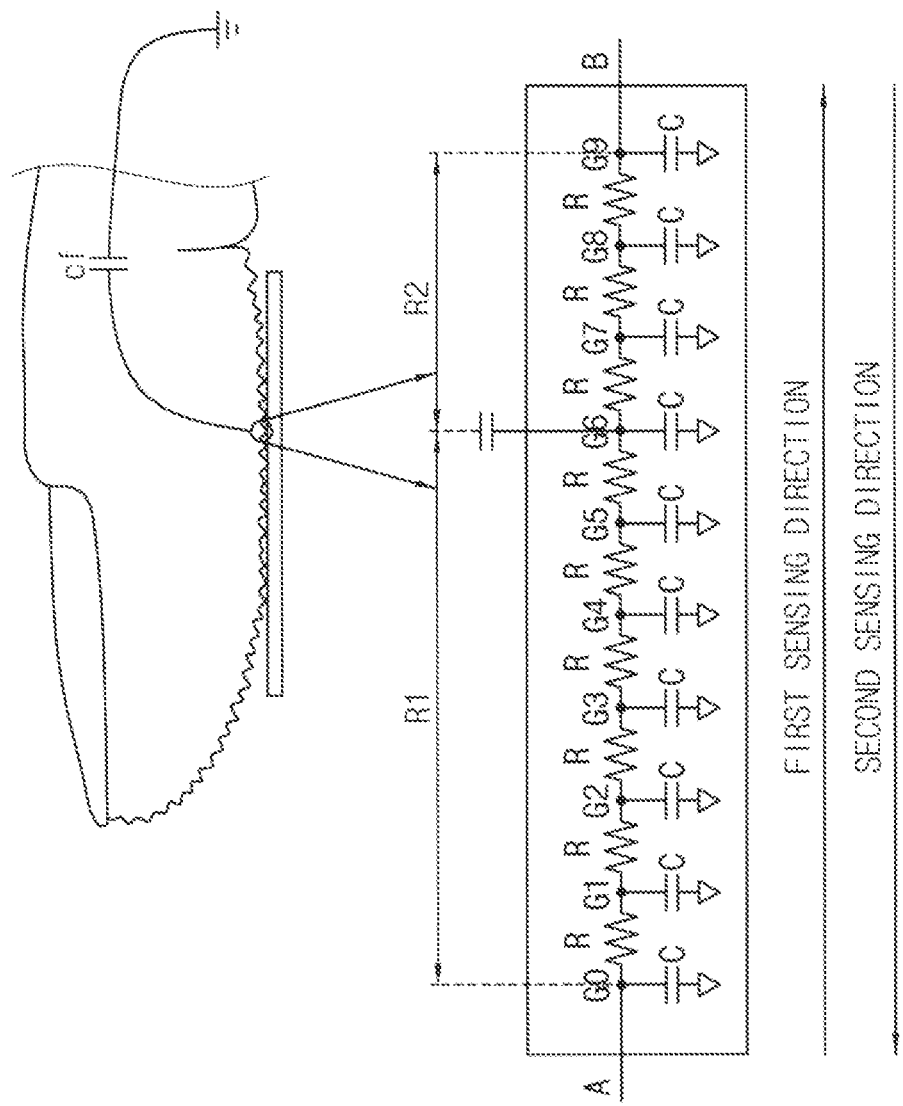
FIG. 6 is a conceptual diagram schematically explaining the principle of capacitance sensing through the TFT sensor array shown in FIG. 2A and FIG. 2B.
Figure 7:
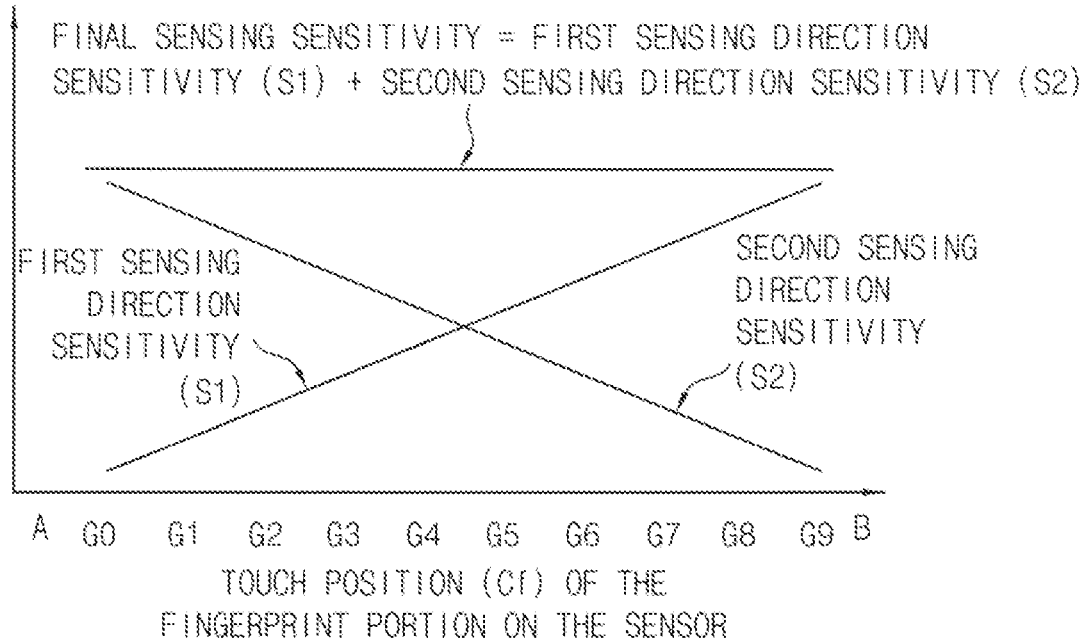
FIG. 7 is a graph schematically explaining a delay of a sensing signal according to a first sensing direction and a second sensing direction shown in FIG. 6.

FIG. 6 is a conceptual diagram schematically explaining the principle of capacitance sensing through the TFT sensor array 110 shown in FIG. 2A and FIG. 2B. FIG. 7 is a graph schematically explaining a delay of a sensing signal according to a first sensing direction and a second sensing direction shown in FIG. 6.

Referring to FIG. 6 and FIG. 7, an example in which eight fingerprint sensors are connected to one sensing line is shown for convenience of explanation. One fingerprint sensor may be defined as a resistor and a capacitor connected in parallel. It is assumed that the resistance values of the resistors R are equal to each other and the capacitance values of the capacitors C are equal to each other. Since eight fingerprint sensors are disposed thereon, nine nodes G0, G1, G2, G3, G4, G5, G6, G7, G8 and G9 are formed thereon.

It is assumed that the parasitic capacitance C of each node G0 to G9 is a negligible value, and the change of the touch value generated by the ridge and valley of the finger is measured. Here, the ridge as the capacitances corresponding to the touch is assumed to be Cf, and the valley as the capacitances corresponding to the untouched is assumed to be zero.

When the touch (Cf) occurs at the node G0, the TX delay time constant corresponding to the first sensing direction is R*0*Cf and the TX delay time constant corresponding to the second sensing direction is R*8*Cf. Therefore, the sum of the TX delay time constants corresponding to the two directions is R*8*Cf. That is, the sum of the TX delay time constants corresponding to the two directions is calculated as (R*0*Cf)+(R*8*Cf)=R*8*Cf.

When the touch Cf occurs at the node G1, the TX delay time constant corresponding to the first sensing direction is R*1*Cf and the TX delay time constant corresponding to the second sensing direction is R*7*Cf. Therefore, the sum of the TX delay time constants corresponding to the two directions is R*8*Cf.

When the touch Cf occurs at the node G6, the TX delay time constant corresponding to the first sensing direction is R*5*Cf and the TX delay time constant corresponding to the second sensing direction is R*3*Cf. Therefore, the sum of the TX delay time constants corresponding to the two directions is R*8*Cf.

When the touch Cf occurs at the node G9, the TX delay time constant corresponding to the first sensing direction is R*8*Cf and the TX delay time constant corresponding to the second sensing direction is R*0*Cf. Therefore, the sum of the TX delay time constants corresponding to the two directions is R*8*Cf.

As described above, it can be confirmed that the sum of the TX delay time constant corresponding to the first sensing direction and the TX time constant delay time constant corresponding to the second sensing direction is the same at any portion of each node.

Figure 8:
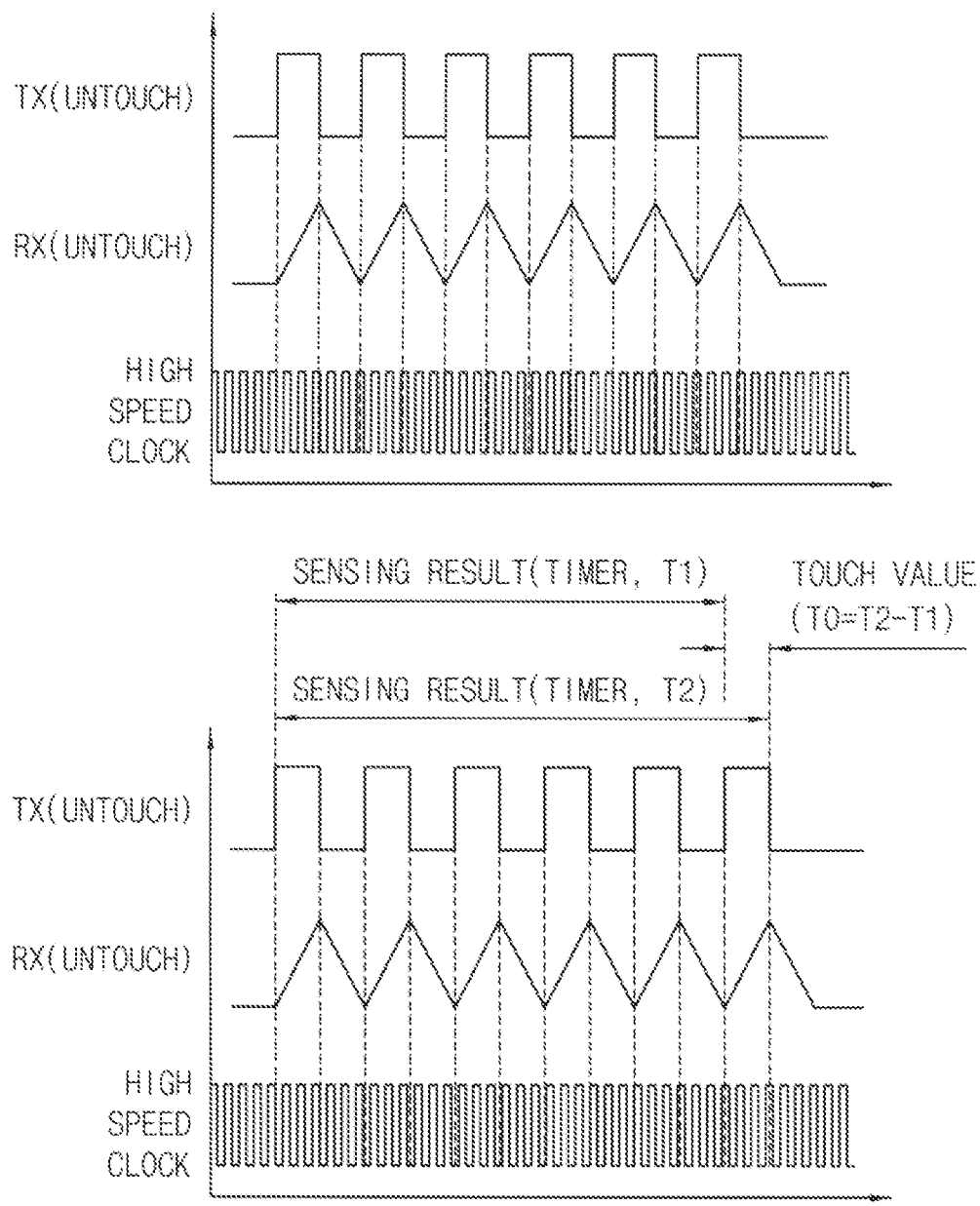
FIG. 8 is a timing diagram corresponding to each valley of a finger and ridge of a finger.

FIG. 8 is a timing diagram corresponding to each valley of a finger and ridge of a finger. An upper diagram of FIG. 8 is a timing diagram assuming that the fingerprint sensor is in an untouched state when the fingerprint sensor meets valleys of the finger, and a lower diagram of FIG. 8 is timing chart assuming that the fingerprint sensor is in a touch state when the fingerprint sensor meets ridges of the finger.

The touch capacitance Cf applied due to the ridge of the finger is increased at the electrode, so that a delay of the time constant of the driving signal TX and the sensing signal RX occurs. When the delayed time after the CYC is measured with a high-speed clock, the measurement difference value T0 for the case of the ridge T2 and the case of the valley T1 is obtained. Through this combination of information, the images of ridges and valleys in each fingerprint sensor array becomes the image of the fingerprint.

Figure 9:
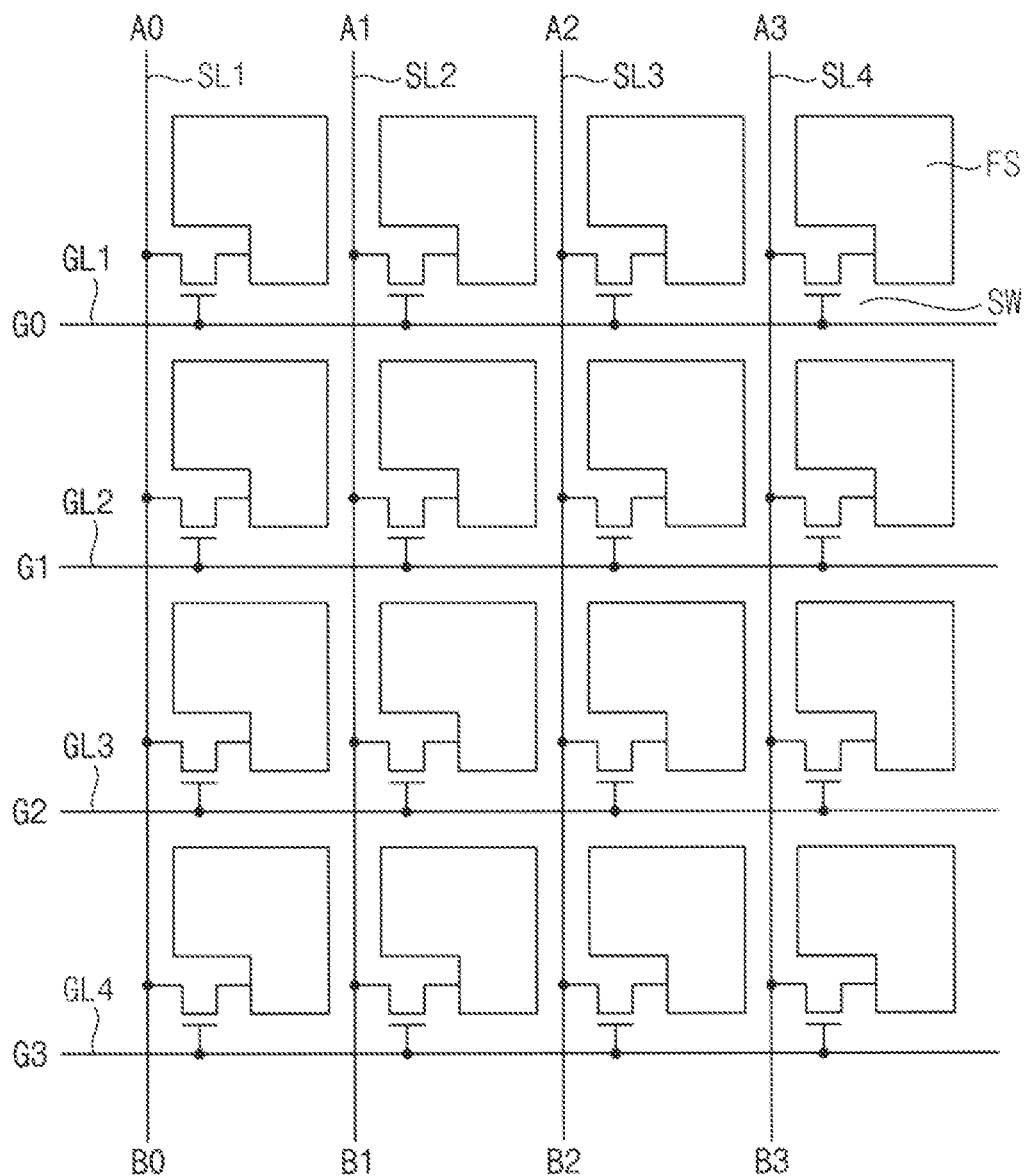
FIG. 9 is a circuit diagram schematically explaining the TFT sensor array shown in FIG. 2A and FIG. 2B.

FIG. 9 is a circuit diagram schematically explaining the TFT sensor array 110 shown in FIG. 2A and FIG. 2B.

Referring to FIG. 9, the TFT sensor array 110 includes a plurality of gate lines GL1, GL2, GL3 and GL4, a plurality of sensing lines SL1, SL2, SL3 and SL4, a plurality of TFTs SW connected to the sensing line, and a fingerprint recognition pattern FS connected to each of the TFTs SW. In the present exemplary embodiment, four gate lines and four sensing lines are shown for convenience of explanation, but the present invention is not limited thereto.

Each of the gate lines GL1, GL2, GL3 and GL4 applies gate signals provided from an external device to the gate electrode of the TFTs.

One side of each of the sensing lines SL1, SL2, SL3 and SL4 applies a driving signal to the TFTs, and the other side of each of the sensing lines SL1, SL2, SL3 and SL4 deliveries a sensing signal to an external device through the TFTs.

Each of the TFTs SW includes a gate electrode connected to the gate line, a sensing electrode connected to the sensing line, and a drain electrode connected to the fingerprint recognition pattern FS.

The fingerprint recognition pattern FS is connected to the drain electrode of the TFT SW to provide a capacitance value according to the contact of the finger ridge or valley to the sensing line through the TFT SW.

The fingerprint recognition pattern FS may be defined by extending the drain electrode of the TFT SW. A transparent electrode such as ITO may be separately formed so that the fingerprint recognition pattern FS may be defined.

Figure 10A:
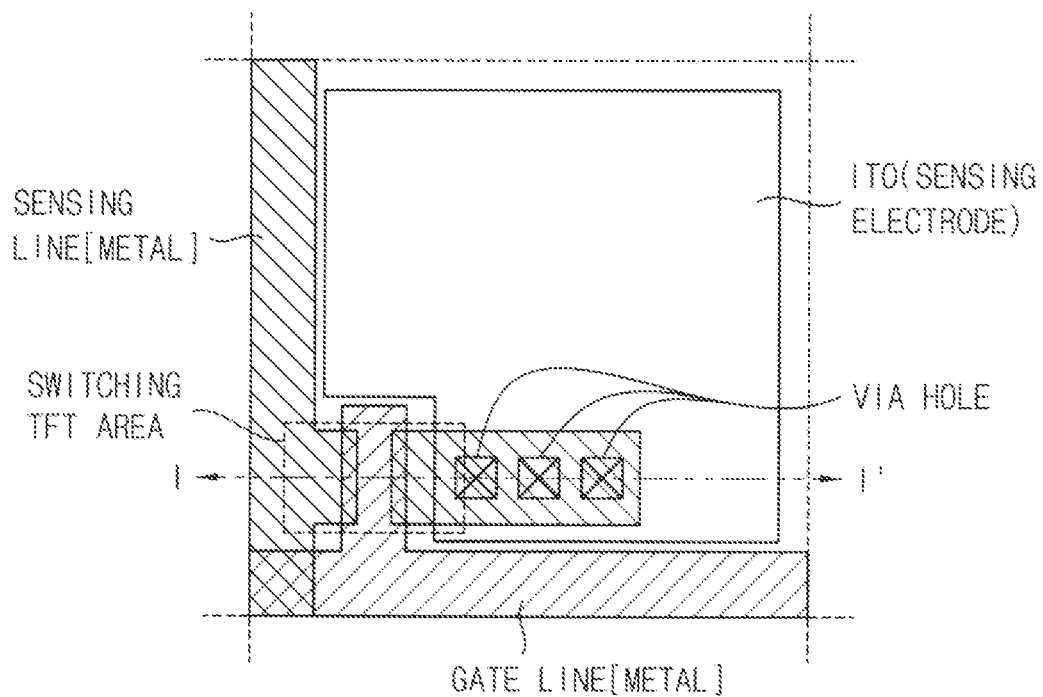
FIG. 10A is a plan view schematically explaining an example of the fingerprint sensor shown in FIG. 8.
Figure 10B:
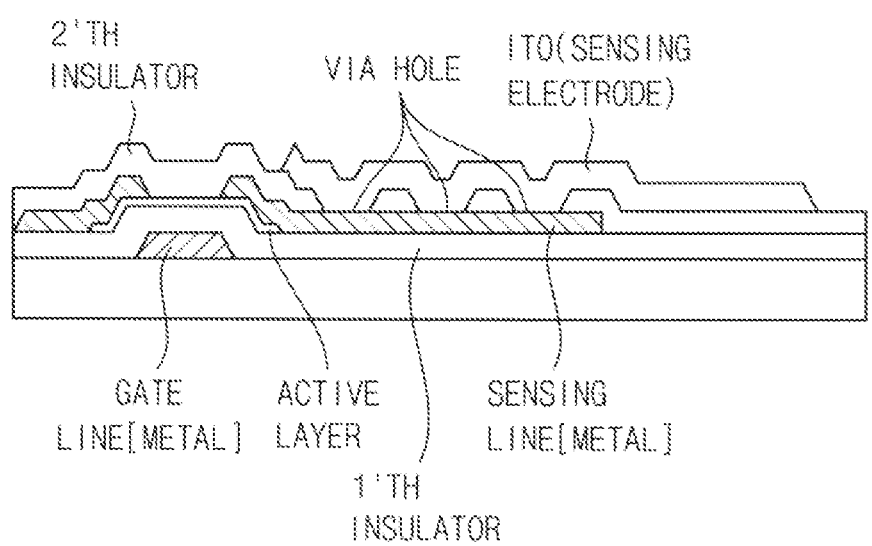
FIG. 10B is a sectional view taken along line I-I' of the fingerprint sensor of FIG. 10A.

FIG. 10A is a plan view schematically explaining an example of the fingerprint sensor shown in FIG. 8, and FIG. 10B is a sectional view taken along line I-I' of the fingerprint sensor of FIG. 10A.

Referring to FIG. 10A and FIG. 10B, the fingerprint sensor includes a base substrate, a gate line formed on the base substrate in the first direction, a gate electrode protruding from the gate line, a semiconductor layer covering the gate line and the gate electrode, a semiconductor layer formed in a channel area of a TFT, a sensing line formed on the first insulation layer in a second direction, a source electrode protruding from the sensing line and covering a portion of the semiconductor layer, a second insulation layer covering the sensing line, the source electrode and the drain electrode, and a fingerprint recognition pattern formed on an area defined by adjacent gate lines and adjacent sensing lines to be connected to the drain electrode through a via hole formed in the second insulation layer.

Figure 11A:
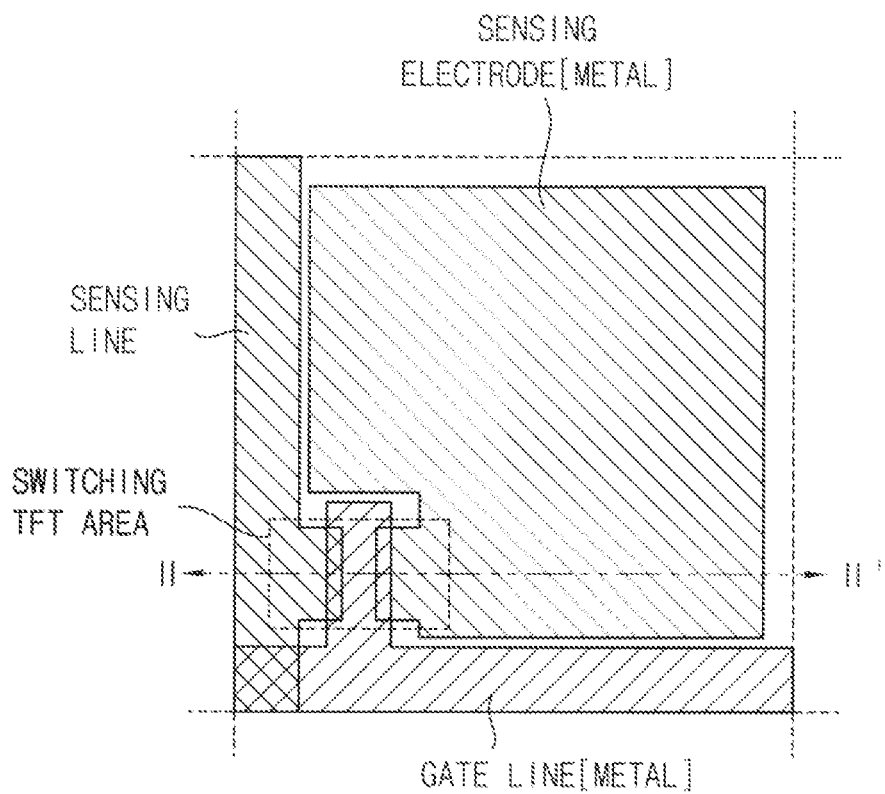
FIG. 11A is a plan view schematically explaining another example of the fingerprint sensor shown in FIG. 9.
Figure 11B:
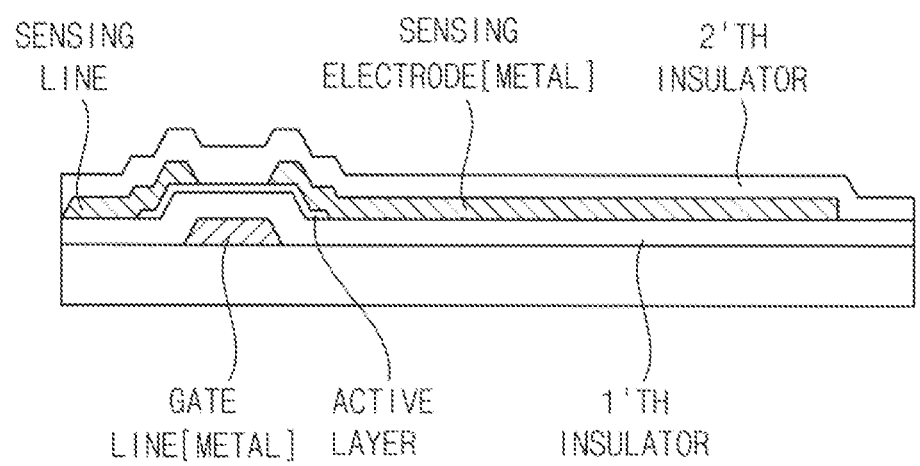
FIG. 11B is a sectional view taken along line II-II' of the fingerprint sensor of FIG. 11A.

FIG. 11A is a plan view schematically explaining another example of the fingerprint sensor shown in FIG. 9, and FIG. 11B is a sectional view taken along line II-II' of the fingerprint sensor of FIG. 11A.

Referring to FIG. 11A and FIG. 11B, the fingerprint sensor includes a base substrate, a gate line formed on the base substrate in a first direction, a gate electrode protruding from the gate line, a first insulation layer covering the gate line and the gate electrode, a semiconductor layer formed on a channel area of a TFT, a sensing line formed on the first insulation layer in a second direction, a source electrode protruding from the sensing line and covering a portion of the semiconductor layer, a drain electrode spaced apart from the source electrode to cover a portion of the semiconductor layer, and a second insulation layer covering the sensing line, the source electrode and the drain electrode. In the present exemplary embodiment, the drain electrode is extended to cover an area defined by adjacent gate lines and adjacent sensing lines to define a fingerprint recognition pattern.

Figure 12A:
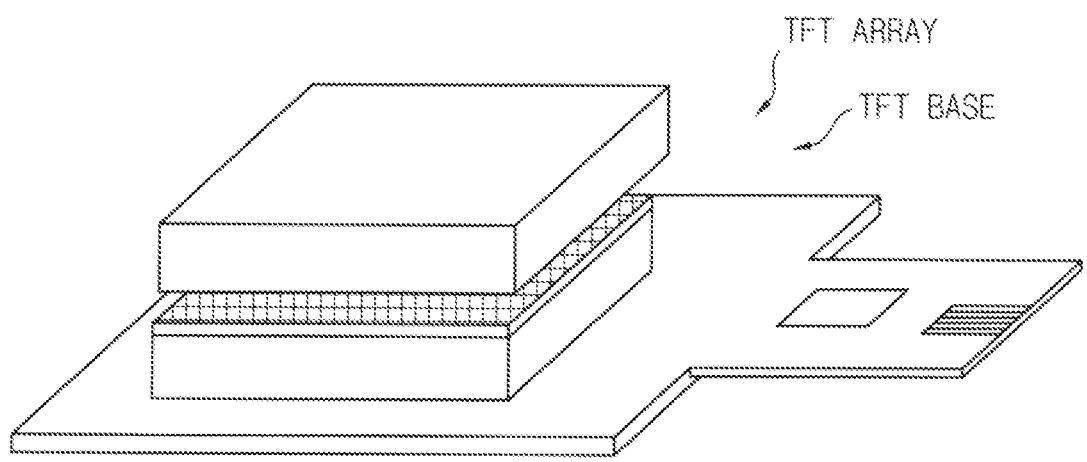
FIG. 12A is a perspective view schematically explaining a fingerprint recognition module assembled according to an exemplary embodiment of the present invention.
Figure 12B:
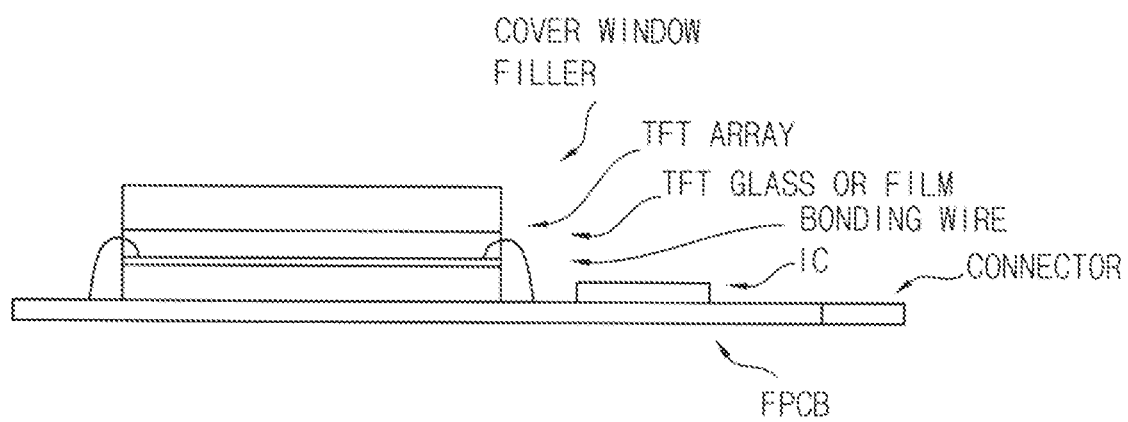
FIG. 12B is a side view of the fingerprint recognition module shown in FIG. 12A.

FIG. 12A is a perspective view schematically explaining a fingerprint recognition module assembled according to an exemplary embodiment of the present invention, and FIG. 12B is a side view of the fingerprint recognition module shown in FIG. 12A.

Referring to FIG. 12A and FIG. 12B, a TFT sensor array is disposed in a normal direction on a printed circuit board (PCB) or a flexible printed circuit board (FPCB) so that a fingerprint recognition module is manufactured. That is, the TFT sensor array is formed on a front surface of a base substrate, and a rear surface of the base substrate contacts the printed circuit board.

A filler (i.e., a filling material) and a cover window are sequentially disposed on a front surface of the TFT sensor array so that a fingerprint recognition module may be manufactured. Here, a connection between electrodes of the TFT sensor array and electrodes of the PCB or the FPCB is connected through a bonding wire.

Figure 13A:
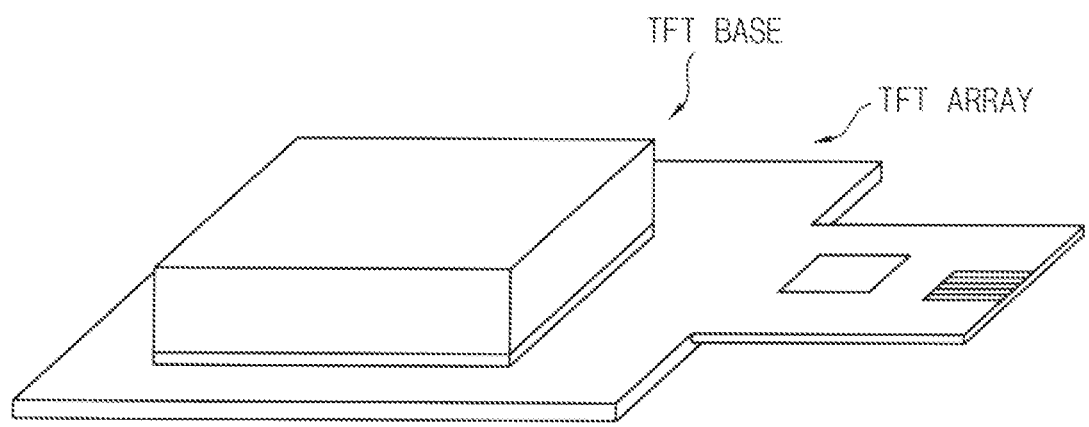
FIG. 13A is a perspective view schematically explaining a fingerprint recognition module assembled according to another exemplary embodiment of the present invention.
Figure 13B:
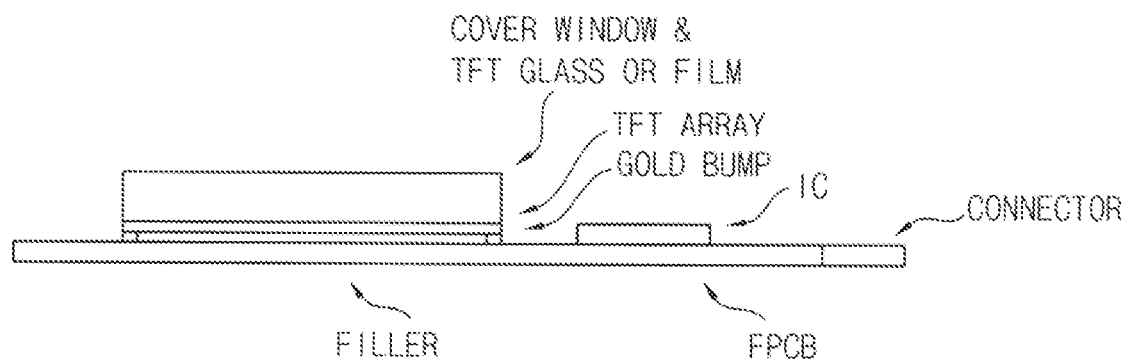
FIG. 13B is a side view of the fingerprint recognition module shown in FIG. 13A.

FIG. 13A is a perspective view schematically explaining a fingerprint recognition module assembled according to another exemplary embodiment of the present invention, and FIG. 13B is a side view of the fingerprint recognition module shown in FIG. 13A.

Referring to FIGS. 13A and 13B, a TFT sensor array is arranged in a reverse direction (that is, an inverted direction) on a printed circuit board (PCB) or a flexible printed circuit board (FPCB) so that a fingerprint recognition module is manufactured. That is, the TFT sensor array is formed on a front surface of a base substrate, and the TFT sensor array formed on the front surface of the base substrate contacts the PCB or the FPCB.

The connection between electrodes of the TFT sensor array and electrodes of the PCB or the connection between electrodes of the TFT sensor array and electrodes of the FPCB are electrically connected by conductive bumps or conductive balls. A filler (that is, a filling material) is disposed on a space in which the conductive bumps or the conductive balls are not disposed.

In this case, the connection between the electrode of the TFT and the electrode of the PCB or the connection between the electrode of the TFT and the electrode of the FPCB may be realized by conductive bumps or conductive balls.

Since this method can reduce the thickness of the fingerprint recognition module in the vertical direction, it is possible to realize a fingerprint recognition module having the merit of a light and thin fingerprint.

Further, since the electrical connection of the PCB or the FPCB is realized by using conductive bumps or conductive balls instead of the bonding wires, it is possible to reduce the manufacturing cost of the TFT sensor array. Moreover, it is possible to increase the productivity of the TFT sensor array. Furthermore, it is possible to improve the yield of the good product of the TFT sensor array.

Moreover, when the base of the TFT sensor array is made of glass, it is possible to reduce a thickness by etching the glass surface on which the TFT is not formed (i.e., the glass surface opposite to the TFT), thereby adjusting a distance between the fingerprint sensor (that is, the TFT sensor array) and a fingerprint only by the thickness of the glass. This advantage not only keeps the touch sensitivity uniform, but also increases the thickness of the glass by increasing the etching thickness, thereby increasing the recognition sensitivity of the fingerprint.

Moreover, non-conductive materials may be applied to a cover window by decoration or the like using a process such as printing, vapor deposition, coating, or lamination on the etched surface of the glass used as the base of the TFT sensor array. This facilitates the work of enhancing the merchantability in the design part of the final module product and saves manufacturing and processing costs.

Having described exemplary embodiments of the present invention, it is further noted that it is readily apparent to those of reasonable skill in the art that various modifications may be made without departing from the spirit and scope of the invention which is defined by the metes and bounds of the appended claims.

[Description of reference numerals]

| | |
|---|---|
| 110: a TFT sensor array | 120: a gate driver |
| 130: an upper switch | 140: a lower switch |
| 150: a sensing driving unit | 160: a timing control unit |
| 200: a capacitance measurement circuit | 410: a reference voltage generator |
| 420: a voltage comparison unit | 430: a control unit |
| 450 a charge/discharge circuit unit | 460: a transmission/reception switching unit |
| COMP_UP: a first voltage comparator | COMP_DN: a second voltage comparator |

What is claimed is:

1. A capacitive fingerprint recognition unit comprising:
a thin-film transistor (TFT) sensor array comprising a plurality of gate lines, a plurality of sensing lines, a plurality of TFTs connected to the gate line and the sensing line, and a fingerprint recognition pattern connected to each of the TFTs;
a gate driver sequentially supplying a gate signal to the gate line;
an upper switch connected to a first end of each of the sensing lines to switch an output path of a driving signal for fingerprint recognition and a sensing signal according to fingerprint recognition; and
a lower switch connected to a second end of each of the sensing lines to switch and output path of a driving signal for fingerprint recognition and a sensing signal according to fingerprint recognition,
during a period in which one gate line is active,
wherein a driving signal for fingerprint recognition is sequentially applied to a first end of each of the sensing lines, a sensing signal corresponding to fingerprint recognition is sequentially output through a second end of each of the sensing lines, and
wherein the driving signal is sequentially applied to the second end of each of the sensing lines, and the sensing signal is sequentially output through the first end of each of the sensing lines.

2. The capacitive fingerprint recognition unit of claim 1, during a first time period, wherein the upper switch provides a driving signal for fingerprint recognition provided from an outside to a first end of each of the sensing lines, and the lower switch provides a sensing signal according to the fingerprint recognition received through a second end of each of the sensing lines to the outside, and during a second time period, wherein the lower switch provides a driving signal for fingerprint recognition provided from an outside to the second end of each of the sensing lines, and the upper switch provides a sensing signal according to the fingerprint recognition received through the first end of each of the sensing lines to the outside.

3. The capacitive fingerprint recognition unit of claim 2, wherein the first time period and the second time period are within an active period of a gate signal applied to the gate line.

4. The capacitive fingerprint recognition unit of claim 1, wherein the gate driver, the upper switch and the lower switch are formed in an area surrounding the TFT sensor array.

5. A capacitance measuring circuit of a fingerprint sensor connected to a thin-film transistor (TFT) sensor array comprising a plurality of gate lines, a plurality of sensing lines, a plurality of TFTs connected to the gate line and the sensing line, and a fingerprint recognition pattern connected to each of the TFTs to recognize a fingerprint, the capacitance measuring circuit comprising:
a gate driver sequentially supplying gate signals to the gate lines;
an upper switch connected to a first end of each of the sensing lines;
a lower switch connected to a second end of each of the sensing lines;
a sensing driver providing a first driving signal for fingerprint recognition to the upper switch, receiving a first direction sensing signal according to fingerprint recognition through the lower switch for a first time, providing a second driving signal for fingerprint recognition to the lower switch, and receiving a second direction sensing signal according to fingerprint recognition through the upper switch for a second time; and
a timing control unit controlling the gate driving unit and the sensing driving unit, and determining a sensitivity of the touch based on the first direction sensing signal and the second direction sensing signal.

6. The capacitance measuring circuit of a fingerprint sensor of claim 5, during the first time, wherein the upper switch sequentially provides the first driving signal to each of the sensing lines, and the lower switch sequentially receives the first direction sensing signal from each of the sensing lines.

7. The capacitance measuring circuit of a fingerprint sensor of claim 5, during the second time, wherein the lower switch sequentially provides the second driving signal to each of the sensing lines, and the upper switch sequentially receives the second direction sensing signal from each of the sensing lines.

8. The capacitance measuring circuit of a fingerprint sensor of claim 5, wherein the sensing driver comprises:
a voltage comparison unit outputting a first comparison signal comparing a first reference voltage with a sensing voltage based on the fingerprint recognition pattern and a second comparison signal comparing a second reference voltage with the sensing voltage in response to a first control signal;
a control unit outputting a charge control signal and a discharge control signal based on the first and second comparison signals in response to a second control signal;
a transmission/reception switching unit connected to both ends of the sensing lines, designed to set a path for transmitting a driving signal to the sensing line and a path for receiving a sensing signal sensing a capacitance change amount of the fingerprint recognition pattern via the sensing line in response to a third control signal;
a charge/discharge circuit part charging the fingerprint recognition pattern connected to the sensing line selected by the transmission/reception switching unit from the first reference voltage to the second reference voltage or discharging from the first reference voltage to the first reference voltage in response to the charge control signal and the discharge control signal; and
a timer unit measuring a charging time and a discharging time of the charge/discharge circuit unit and a time required for the entire charging and discharging, respectively, to output an output signal according to the measuring, in response to the third control signal and the fourth control signal.

9. The capacitance measuring circuit of a fingerprint sensor of claim 8, wherein the timing control unit comprises:
a control signal generator generating a gate control signal (GS) controlling an operation of the gate driver, the first control signal, the second control signal, the charge control signal, the discharge control signal, the third control signal and the fourth control signal based on a clock; and
a counter providing the clock to the control signal generator, counting the number of pulses in accordance with the first direction sensing signal to output the counted number to an external device, and counting the number of pulses corresponding to the second direction sensing signal to output the counted number to the external device.

10. A fingerprint recognition device comprising:
a thin-film transistor (TFT) sensor array comprising a plurality of gate lines, a plurality of sensing lines, a plurality of TFTs connected to the gate line and the sensing line, and a fingerprint recognition pattern connected to each of the TFTs;
a gate driver sequentially supplying gate signals to the gate lines;
an upper switch connected to a first end of each of the sensing lines;
a lower switch connected to a second end of each of the sensing lines;
a sensing driver providing a first driving signal for fingerprint recognition to the upper switch, receiving a first direction sensing signal according to fingerprint recognition through the lower switch for a first time, providing a second driving signal for fingerprint recognition to the lower switch and receiving a second direction sensing signal according to fingerprint recognition through the upper switch for a second time; and
a timing control unit controlling the gate driving unit and the sensing driving unit, and determining a sensitivity of the touch based on the first direction sensing signal and the second direction sensing signal to measure whether a ridge of the user finger is laid on a specific pixel.

11. The fingerprint recognition device of claim 10, wherein a drain electrode of the TFT extends to define the fingerprint recognition pattern.

12. The fingerprint recognition device of claim 10, wherein the TFT sensor array further includes a transparent electrode connected to a drain electrode of the TFT to define the fingerprint recognition pattern.

13. The fingerprint recognition device of claim 10, wherein the TFT sensor array is formed on a glass substrate or a flexible substrate.

14. The fingerprint recognition device of claim 10, wherein the capacitance measuring circuit determines the sensitivity of the touch based on a value obtained by arithmetically summing the first direction sensing signal and the second direction sensing signal.

15. The fingerprint recognition device of claim 10, wherein the capacitance measuring circuit determines the sensitivity of the touch based on a value obtained by arithmetically averaging the first direction sensing signal and the second direction sensing signal.

16. The fingerprint recognition device of claim 10, wherein the TFT sensor array is formed on a front surface of a base substrate, and a rear surface of the base substrate contacts to a printed circuit board.

17. The fingerprint recognition device of claim 16, further comprising:
a filling material disposed over the TFT sensor array; and
a cover window disposed on the filling material.

18. The fingerprint recognition device of claim 16, further comprising a bonding wire electrically connecting the TFT sensor array and the printed circuit board.

19. The fingerprint recognition device of claim 16, wherein the sensing driver and the timing control unit are implemented in an IC form to be mounted on the printed circuit board.

20. The fingerprint recognition device of claim 10, wherein the TFT sensor array is formed on a front surface of a base substrate, and the front surface of the base substrate contacts to a printed circuit board or a flexible printed circuit board.

21. The fingerprint recognition device of claim 20, wherein the front surface of the base substrate is electrically connected to the printed circuit board or the flexible printed circuit board by conductive bumps or conductive balls.

* * * * *